(12) United States Patent
Walck

(10) Patent No.: US 8,742,346 B1
(45) Date of Patent: Jun. 3, 2014

(54) SPUTTER REMOVAL OF MATERIAL FROM MICROSCOPY SAMPLES WITH RF GENERATED PLASMA

(71) Applicant: South Bay Technology, San Clemente, CA (US)

(72) Inventor: Scott D. Walck, Oceanside, CA (US)

(73) Assignee: South Bay Technology, Inc., San Clemente, CA (US)

( * ) Notice: Subject to any disclaimer, the term of this patent is extended or adjusted under 35 U.S.C. 154(b) by 0 days.

(21) Appl. No.: 13/650,737

(22) Filed: Oct. 12, 2012

Related U.S. Application Data

(63) Continuation of application No. 12/108,353, filed on Apr. 23, 2008, now Pat. No. 8,288,737.

(60) Provisional application No. 60/926,052, filed on Apr. 23, 2007.

(51) Int. Cl.
*H01J 37/20* (2006.01)

(52) U.S. Cl.
USPC ...... 250/311; 250/307; 250/301; 250/440.11; 250/492.1; 250/492.3

(58) Field of Classification Search
USPC ............ 250/306, 307, 309, 310, 311, 440.11, 250/491.1, 492.1, 492.3
See application file for complete search history.

(56) References Cited

U.S. PATENT DOCUMENTS

| | | | |
|---|---|---|---|
| 2,719,355 A | 10/1955 | Diffenderfer | |
| 3,418,465 A * | 12/1968 | Hahn et al. | 250/311 |
| 5,326,971 A * | 7/1994 | Theodore et al. | 250/311 |
| 5,367,171 A | 11/1994 | Aoyama et al. | |
| 5,633,502 A | 5/1997 | Fischione | |
| 6,388,366 B1 * | 5/2002 | Pryor | 313/311 |
| 6,479,830 B1 | 11/2002 | Fornaca et al. | |
| 6,576,910 B2 | 6/2003 | Hashikawa et al. | |
| 6,610,257 B2 | 8/2003 | Vane | |
| 6,667,475 B1 | 12/2003 | Parran et al. | |
| 6,777,674 B2 | 8/2004 | Moore et al. | |
| 6,870,161 B2 * | 3/2005 | Adachi et al. | 250/311 |

(Continued)

OTHER PUBLICATIONS

Isabell et al., "Plasma Cleaning and Its applications for Electron Microscopy", Microscopy and Microanalysis 5, 126-135 (1999).*

(Continued)

*Primary Examiner* — Michael Logie
(74) *Attorney, Agent, or Firm* — Stout, Uxa, Buyan & Mullins, LLP; Donald E. Stout

(57) ABSTRACT

A plasma system for changing a microscopy material sample comprises a microscopy material sample holder for holding a microscopy material sample in place in a desired orientation, and a receptacle holder for receiving the sample holder and an RF antenna. The microscopy sample is positioned relative to the antenna so that no point on the antenna is in direct line-of-sight contact with the microscopy sample. This feature of avoiding direct line-of-sight contact between the antenna and the sample assists in preventing, or at least minimizing, ion sputtering of system component material onto the specimen or sample 10 that is being trimmed. Moreover, portions of the system which are in direct line-of-sight contact with the sample are comprised of material having a low sputtering yield, preferably carbon. The material may comprise graphite, and may be in the form of a carbon coating or a carbon paint.

4 Claims, 12 Drawing Sheets

(56) References Cited

U.S. PATENT DOCUMENTS

| | | | |
|---|---|---|---|
| 6,967,335 B1 | 11/2005 | Dyer et al. | |
| 7,112,790 B1 | 9/2006 | Wang | |
| 7,115,882 B2 | 10/2006 | Moore | |
| 7,126,132 B2 | 10/2006 | Moore | |
| 8,288,737 B1 * | 10/2012 | Walck | 250/440.11 |
| 2004/0108067 A1 * | 6/2004 | Fischione et al. | 156/345.38 |
| 2004/0228578 A1 | 11/2004 | Cronk et al. | |
| 2005/0054029 A1 * | 3/2005 | Tomimatsu et al. | 435/40.5 |
| 2005/0103444 A1 * | 5/2005 | Brcka | 156/345.48 |
| 2005/0178980 A1 * | 8/2005 | Skidmore et al. | 250/492.21 |
| 2006/0027324 A1 * | 2/2006 | Makino et al. | 156/345.24 |
| 2006/0045987 A1 | 3/2006 | Chandler et al. | |
| 2009/0309018 A1 | 12/2009 | Smith et al. | |

OTHER PUBLICATIONS

Tsung, et al., FIB/TEM Sample Preparation Using a Wafer Dicing Saw, Microscopy Society of America, Microsc. Microanal. 6, Suppl 2, 2000.

* cited by examiner

US 8,742,346 B1

SPUTTER REMOVAL OF MATERIAL FROM MICROSCOPY SAMPLES WITH RF GENERATED PLASMA

This application is a continuation application under 35 U.S.C. 120 of the commonly assigned U.S. application Ser. No. 12/108,353, filed Apr. 23, 2008, and now U.S. Pat. No. 8,288,737, issued on Oct. 16, 2012, which in turn claims the benefit under 35 U.S.C. 119(e) of the filing date of Provisional U.S. Application Ser. No. 60/926,052, entitled Methods & Systems for the Low Energy and Low Angle Ion Sputter Removal of Material from Thin Microscopy Samples with Ions Extracted from an RF Generated Plasma, filed on Apr. 23, 2007. Both applications are expressly and entirely incorporated herein by reference.

Additionally, this application is related to commonly assigned U.S. application Ser. No. 11/712,830, entitled Reusable Holder for Transmission Electron Microscopy (TEM), Scanning Electron Microscopy (SEM), and Focused Ion Beam (FIB) Samples, filed on Feb. 28, 2007 and now issued as U.S. Pat. No. 7,759,656, issued on Jul. 20, 2010, which application is expressly and entirely incorporated herein by reference.

BACKGROUND OF THE INVENTION

This invention generally relates to assemblies for holding material specimens, and more particularly relates to a specimen holder and mating receptacle holder arrangement for a plasma system in which a voltage is applied to the sample by either self-biasing or an external biasing system, and in which the imposed electric field at the sample due to this voltage is shaped by both the geometry of the specimen and the geometry of the holder in such a way as to cause low energy ions from the plasma to ion sputter material from the surface and near surface region at a low angle to improve the imaging of the sample in a transmission electron microscope (TEM), field ion microscope (FIM), position sensitive atom probe, or a three dimensional atom probe.

A critical requirement for high resolution transmission electron microscopy (TEM) and high resolution electron energy loss spectroscopy is that the sample should be very thin relative to traditionally prepared and examined TEM specimens. It is well known that the conventional methods of preparing TEM specimens produce artifacts that detract from the quality of high resolution images because of damage at the top and bottom of the sample. With the specimen thickness requirements of the highest resolution instruments that can achieve sub-angstrom resolution, the surface artifacts can become an appreciable thickness fraction of the sample under observation and prevent the achievement of the desired resolution. For example, mechanical polishing techniques to promote electron transparency, such as the tripod polishing technique or dimple grinding, will create surface scratches and subsurface damage in the form of amorphous regions and crystalline defects such as dislocations and dislocation loops and twinning, and can even cause re-crystallization or phase changes. Ion milling for short times by using an Ar ion beam at a low angle is used to remove this type of damage and provides samples that are representative of the original sample when viewed in the TEM. However, it has been shown that even with an ion energy as low as 3 keV and ion milling at an angle of 5°, an amorphous region as thick as 12 nm can be created on both the top and bottom surface of the TEM sample. Focused Ion Beam (FIB) preparation of TEM samples is even worse. The amorphous damage region for 30 keV Ga ions can be 20 nm thick or more on both surfaces of the TEM sample and it can implant Ga into the sample. One direct observation study of the amorphous damage from 30 keV Ga ions used to prepare a TEM sample of silicon showed that the amorphous damage in a wedge shaped sample is 23 nm and this limits the minimum practical thickness for an as-prepared FIB sample imaged in the TEM to about 60 nm. FIB instruments capable operating at low energy can reduce the amorphous region in at TEM sample to about 4 nm. Low angle, low energy Ar ion milling has been shown to reduce this layer to less than 1 nm when an angle of 5° from the surface and energy of 250 eV is used. For preparing FIM samples used in atom probe class instruments such as the position sensitive atom probe or a three dimensional atom probe, FIB has been employed to produce the conical shaped sample that is needed. Here too, the surface of the samples prepared by FIB has the problem of amorphization due to the beam. A pillar of material is often used and prepared by FIB for electron tomography in a scanning transmission electron microscope (STEM).

Plasma processing in commercially available plasma cleaners has been used to remove some of the amorphous damage from FIB samples but not in the manner that will be described in this application. Plasma cleaning of TEM samples and the TEM holder uses oxygen or an oxygen based gas mixture and is typically used to remove hydrocarbon contamination on the samples while they are positioned in the TEM holder assembly. For the removal of amorphous damage, typically Ar or another inert gas is used. Prior to discussing how the plasma processing has removed this amorphous damage in past studies and how the present method is different, a brief description of the plasma is necessary.

A plasma can be described as an ionized gaseous state in which ions, electrons, exited atoms, atomic neutrals, and molecules coexist. The presence of charged particles in the plasma is responsible for its conductivity, which is used to maintain the plasma condition through applied electromagnetic fields. In the majority of practical applications, the plasma generation process requires reduced gas pressures in a space between opposite electrodes and either a DC or an RF electromagnetic field imposed across this space. In these fields, electrons can easily be accelerated and their collisions with molecules and neutral atoms are the basis for the primary mechanism for gas molecule decomposition, excitation, and ionization. This creates chemically active neutrals and ions, which can be beneficially used for surface cleaning. In glow plasma discharges, the random kinetic energy of both neutrals and ions is below 0.1 eV and the plasma ionization rates are typically around 0.1-1%. Although such plasmas are sometimes referred to as cold, they do contain considerably higher energy electrons with energies of 1-3 eV, corresponding to an average temperature of about 24,000 K. Some of the hot electrons have energies of 15-20 eV, which exceed gas ionization potentials and provide gas ionization and excitation, which results in the visible glow of a plasma. From this plasma composition, there are three possible modes for using it in surface cleaning:

(i) Acceleration of positively charged ions with large masses towards the surfaces to be cleaned which causes mechanical sputtering of the contaminants;

(ii) Acceleration of negatively charged electrons towards the surface, with impact momentums insufficient for sputtering, but high enough for heating and thermal activation of surface contaminants; and (iii) Creation of chemically active atoms and radicals to form volatile products with surface contaminants that can be pumped from the vacuum system. The thermalization and surface desorption of these volatile products are enhanced by the presence of the hot electrons in the cold plasmas.

While the first two methods are most efficient in terms of cleaning rates, they are also the most likely to cause irreversible surface modifications by ion implantation, radiation damage, or surface heating when the orientation of the sample is normal to the incident radiation. When the preservation of the surface is a major requirement, such as in sample preparation for surface analysis or TEM preparation, the third mode is more suitable. This method does not require high D.C. (direct current) acceleration voltages and consequently RF (radio frequency) systems are commonly chosen for plasma cleaning systems. It permits efficient cleaning of both conductive and insulating surfaces. For the removal of amorphous damage, the first method is most desirable if the plasma processing parameters can control the energy and angle of the ions. Important parameters in characterizing a plasma are its energy and its density. These are controlled by the gas pressure, the applied power of the electromagnetic fields, and the geometry of the discharge system.

There are two principal geometries for RF plasma cleaners. In the inductively-coupled geometry, an external RF coil surrounds a chamber wall made from an insulating material, such as a quartz tube. This part of the wall acts as an RF electrode, which is positively and negatively charged following the RF field oscillations. In this geometry, the other electrode can be a piece of grounded metal such as part of the vacuum chamber or an inserted electrode. The specimen to be cleaned can either be moved into the quartz portion of the chamber, where it is exposed to both charged and neutral plasma interaction, or it can be placed inside a grounded metal tube connected to the quartz tube, where only chemical interactions can take place, due to the much longer life of chemically active neutrals than charged particles. In the capacitively coupled geometry, a pair of inserted RF electrodes, one of which can be the grounded chamber and the other the active antenna. A sample to be cleaned is placed in the space between these electrodes, where it is exposed to both charged and neutral plasma components.

In a typical RF plasma generator, one electrode is grounded and has a large surface area, e.g. the chamber wall, while the other has a smaller area and is connected to the RF power supply via an impedance matching network. This smaller electrode develops an average negative DC self-biasing potential, $U_{SB}$, due to the different masses and, hence, response times of electrons and ions to the RF oscillations. This electrode is referred to as the cathode, and the chamber wall as the anode. The self-biasing potential of the cathode can be up to several hundred volts and is dropped across a dark cathode sheath, which separates the cathode surface from the glowing plasma. The gradient of this potential is the electric field that accelerates ions from the plasma towards the cathode surface and may cause sputtering if $U_{SB}$ is high enough. For cleaning procedures this is undesirable, since the sputtered cathode material will be deposited onto the surface being cleaned. This can be prevented either by keeping $U_{SB}$ below the sputtering threshold for the cathode material or by shielding the sample from sputtered material. For plasma cleaning in a capacitively coupled system, the sputtering effects from the antenna are avoided by restricting $U_{SB}$ to below the sputtering threshold for the cathode material by restricting the RF power. The same is true for an inductively coupled system. In addition, in both types of systems, the sample can be moved into the non-plasma position where it is shielded from direct sputtering, as described above. This is sometimes referred to as down-stream processing.

In both geometries, the plasma can have its own potential, $U_P$, with respect to ground, due to the difference in the mobility of electrons and ions. For practical purposes, a plasma floating potential, $U_F$, is also important, which reflects the potential of an insulated probe inserted into the plasma with respect to $U_P$. When a floating surface is inserted into the plasma it is bombarded with ions having kinetic energies of $e(U_P-U_F)$, which could be within the range of 5 to 40 eV for commonly used RF plasmas. If the immersed surface is biased negatively, it will attract ions from the plasma. If the immersed surface is grounded, it acts as an additional anode. In typically used geometries, the total area of the anode is considerably larger than the area of the cathode and $U_P$ is positive with respect to the anode, causing ion bombardment. If the anode area is small compared to the cathode area, then the plasma potential is shifted towards negative values. However, this shift will always be below the gas ionization potential. The shift of the plasma potential also depends critically on the plasma parameters. The plasma potential will be shifted positively if the RF power is increased or if the pressure is reduced. As discussed above, both of these parameters increase the mobility of the electrons in the plasma. A higher plasma potential results in higher energy ions striking the surface of the grounded sample. The average temperature of the electrons in the plasma can be determined from the plasma potential, since $eU_P=kT_e$, where k is Boltzman's constant and Te is the average electron temperature. The described characteristic potentials of the plasmas can be obtained from voltage/current curves obtained using suitable electrostatic probes. For the commercial plasma cleaners that accept TEM specimen rods, it is possible to obtain representative values of these plasma potentials if an analytical TEM stage with an isolated tip for probe current measurements is used.

For the purpose of the removal of amorphous damage from TEM samples, the consideration of the relative values of the bias voltage on the antenna, $U_{SB}$, the floating potential $U_F$, and the plasma potential, $U_P$, are critically important. For minimizing the thickness of the surface damage region from mechanically polished, ion milled, and FIB prepared TEM samples with ions extracted from the plasma, both the energy and the angle that the ions strike the surface are critical parameters, as they are with the focused low energy ion milling approach. Because of these considerations, for the plasma processing approach outlined in this application, the orientation of the sample is also very important. The removal rate of material from a sample by sputtering is dependent on several parameters that include the ion angle, the material, the ion species, and its energy. As mentioned above, the energy of the ions must be above the materials threshold energy for sputtering to occur. In the plasma cleaner, the energy of the ions striking the sample is determined by the potential difference between the sample and the plasma potential. If the TEM sample is held in a TEM specimen holder, then the ions will strike the surface at normal incidence. Even at low energies, ions impinging normal to a surface will implant and cause sub-surface damage. The removal rate is also very dependent on ion angle. It has been shown that the best surface quality from a polishing standpoint is achieved at an incident angle relative to the surface normal greater than 85° and preferably at about 89° and at lower incident angles, surface roughening can occur.

The first description of a plasma cleaner affecting an FIB prepared sample was done with a capacitively coupled plasma cleaner supplied by South Bay Technology, Inc., the assignee of the present application. In this process, an FIB lift-out sample was held in a TEM holder and Ar was used as the gas because of the damage to the support grid if an oxygen plasma had been used. It was shown that a higher than normal operating power would thin a Zn sample. Since Zn has a high volatility, it is not surprising that it would show sputter removal at a relatively modest power level. Using Ar ions below 1000 eV, Zn and Cd, two similar metals, have at least five times higher sputter yields than any other metal. The orientation of the sample relative to the plasma was parallel so that ions struck the surface at normal incidence. Subsequent studies of plasma processing to thin FIB prepared samples utilize the same orientation. The phrase "plasma trimming" was coined to describe the removal of material from a TEM sample by an Ar plasma in a plasma cleaner. The assignee's experiments with biasing a 500 Å gold-coated Si sample to −133 V demonstrated that the normal incidence processing was very slow. However, this work did demonstrate that the coating near the edges of the sample was removed at a much higher rate. The higher removal rate is due to the increase in the electric field induced at the corners because of the small radius of curvature, since the electric field is proportional to the applied voltage and inversely proportional to the radius of curvature.

SUMMARY OF THE INVENTION

The basis of this application is to configure a TEM sample to be plasma-trimmed in a geometry and orientation within the plasma to modify the trajectory of ions from the plasma to sample in order to enhance the sputter removal rate at low angles in order to remove the damaged region from the sample. The energy and the current of the ions can be reproducibly controlled by controlling the plasma processing parameters and the bias on the sample. Further, the geometry of the system is configured in such a manner as to minimize or eliminate the sputter deposition of material onto the sample from the plasma system or sample holder. Small samples prepared for other microscopies by FIB and other ion beam techniques, such as emitters for Field Ion Microscopy (FIM), Atom Probe (AP), 3D electron microscopy tomography, and 3D positional atom probe that have a conical form have such amorphous surface regions and can also be improved with this invention.

This invention relates to a specimen holder and mating receptacle holder arrangement for a plasma system in which a voltage is applied to the sample by either self-biasing or an external biasing system and the imposed electric field at the sample due to this voltage is shaped by both the geometry of the specimen and the geometry of the holder in such a way as to cause low energy ions from the plasma to ion sputter material from the surface and near surface region at a low angle to improve the imaging of the sample in a transmission electron microscope (TEM), field ion microscope (FIM), position sensitive atom probe or a three dimensional atom probe. It relates to a specimen holder and mating receptacle holder arrangement that can hold and position an in-situ or an ex-situ Focused Ion Beam (FIB) lift-out sample, an FIB prepared "H-bar" cut sample, a mechanically prepared wedge or parallel side shaped TEM sample, or an ion milled TEM sample in the above described plasma processing position for removal of amorphous damage regions associated with these preparation procedures. It relates to a specimen holder and mating receptacle holder arrangement that can accept a commercially available sample holder or a modified version of that holder for in-situ and ex-situ FIB holders in a capacitively coupled plasma system in which the sample is self-biasing. It relates to a holder that can accept a commercially available sample holder or a modified version of that holder for in-situ and ex-situ FIB holders in a plasma system in which the sample is biased due to self-biasing of the antenna. It relates to a holder and mating receptacle holder and adapter system with a geometry and material construction that minimizes the sputter deposition of undesirable material from the holder and other plasma system materials onto the sample. It relates to a specimen holder and mating receptacle holder arrangement that effectively cools the sample during processing so that no appreciable heating of the sample occurs. In addition, the invention can be used in the same manner as described above to further thin TEM samples to a desired thickness after the amorphous damage has been removed.

More particularly, there is provided a plasma system for removing material from a surface of a microscopy sample to remove surface damage and for further controlled thinning of the microscopy sample, which comprises a microscopy sample holder for holding a microscopy sample in place in a desired orientation. The system further comprises a receptacle holder for receiving the sample holder and an RF antenna. The microscopy sample is advantageously positioned relative to the antenna so that no point on the antenna is in direct line-of-sight contact with the microscopy sample. Moreover, portions of the system which are in direct line-of-sight contact with the sample are comprised of material having a low sputtering yield, preferably carbon. The material may comprise graphite, and may be in the form of a carbon coating or a carbon paint.

Preferably, in some of the inventive embodiments, the microscopy sample is actively cooled. When the sample holder is disposed on the antenna, the antenna may be cooled in order to actively cool the microscopy sample. Direct line-of-sight contact between the antenna and the microscopy sample is preferably avoided by arranging the system so that a surface of the receptacle, on which the sample holder is disposed, is at a different level than a level of an adapter plate on which the antenna is disposed. In certain embodiments, the receptacle surface is raised relative to the antenna adapter plate.

In another aspect of the invention, there is provided plasma system for removing material from a surface of a microscopy sample to remove surface damage and for further controlled thinning of the microscopy sample, which comprises a microscopy sample holder for retaining a microscopy sample in place in a desired orientation. The system further comprises a plasma cleaning apparatus having a vacuum chamber and an entry port for entry thereinto. A plasma trimming rod assembly supports the sample holder. A plasma cleaner adapter is provided for facilitating entry of the plasma trimming rod assembly into the plasma cleaner vacuum chamber through the entry port. An external power supply is provided for biasing the sample.

In yet another aspect of the invention, there is disclosed a method for trimming a microscopy sample, which comprises a step of disposing the sample on a specimen holder. The specimen holder is placed in proximity to a source of plasma, and the sample is electrically biased to thereby create electrical fields about the sample which function to alter trajectories of impinging ions from the plasma. The sample is oriented so that the ions impinge on a surface of the sample non-normally and non-parallel thereto.

The invention, together with additional features and advantages thereof, may best be understood by reference to the following description taken in conjunction with the accompanying illustrative drawing.

DETAILED DESCRIPTION OF THE INVENTION

Figure 2:
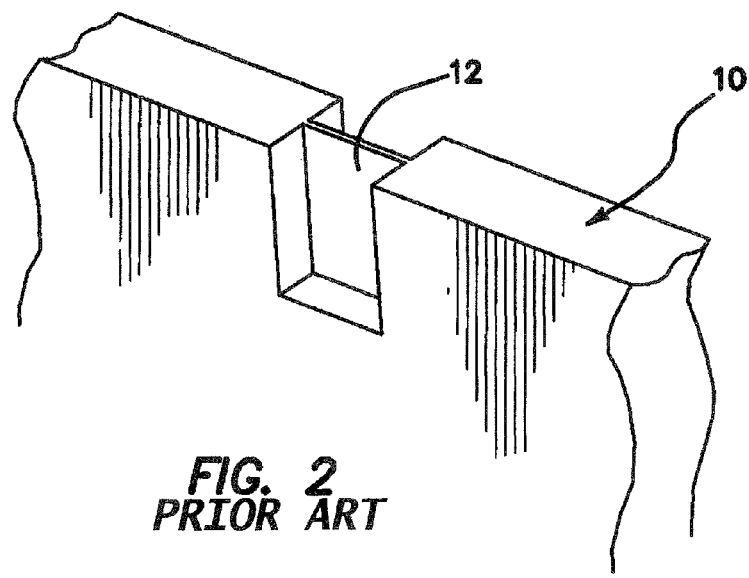
FIG. 2 is a perspective view of an "H-Bar" FIB prepared TEM sample.
Figure 3:
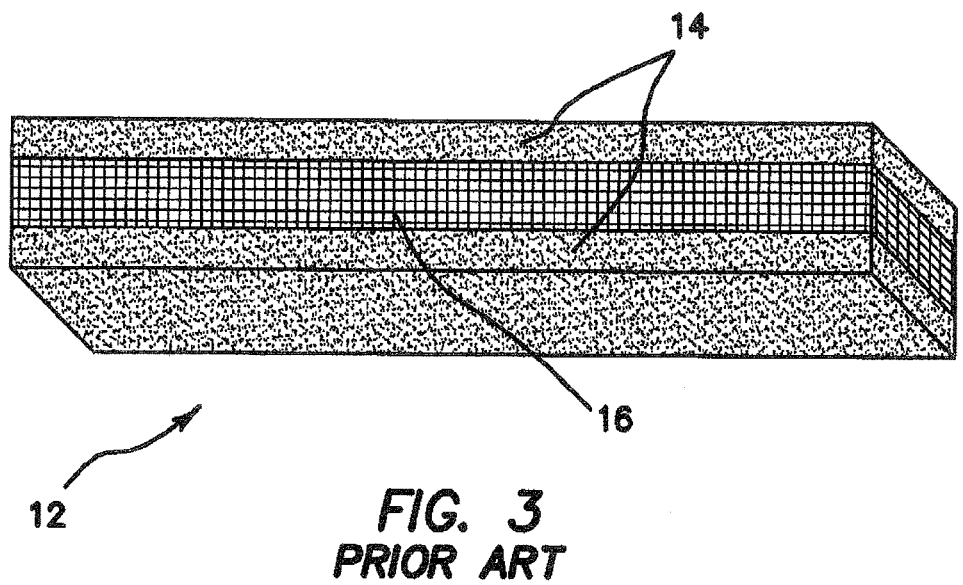
FIG. 3 is a schematic representation of a parallel-sided membrane cut with an FIB.

Referring now more particularly to the drawings, there is shown in FIG. 2 the geometry of a typical prior art "H-Bar" FIB prepared TEM material sample 10. A thin membrane 12 in the center portion of the sample 10 is electron transparent because its thickness typically varies between approximately 20 and 200 nm. This membrane 12 is the "H-Bar" cut membrane portion of the sample 10 which is used as the TEM sample. FIG. 3 illustrates a representative parallel-sided membrane 12, which has been cut with a FIB. Both sidewalls of the membrane 12, which comprise the top and bottom of the TEM sample as it appears in a microscope, can have a thickness of up to 23 nm of an amorphous thickness layer 14 below each surface. An undamaged portion 16 of the sample is the only region representative in the microscope of the original starting material.

Figure 4:
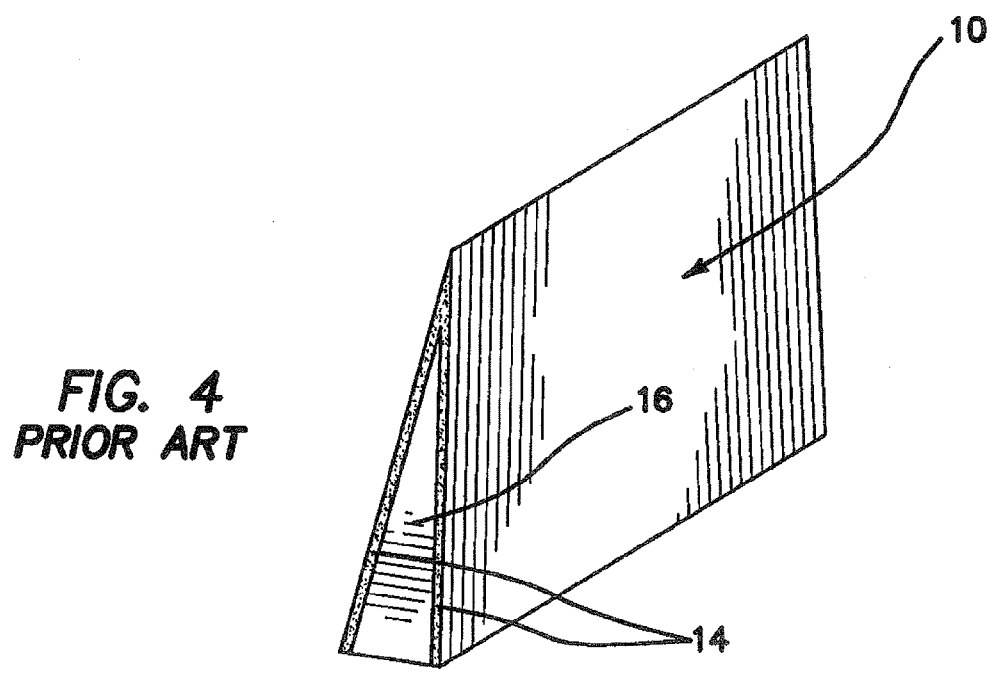
FIG. 4 is a schematic representation of a tapered TEM sample.

Referring now to FIG. 4, there is shown a schematic representation of a tapered prior art TEM sample 10 that might be prepared by ion milling, tripod polishing, or FIB, for example. This sample 10 also exhibits damaged or amorphous layers 14 on the top and bottom of the sample, with an undamaged sample portion 16 between the layers 14. In the thinnest portions of the sample, the damaged layers 14 can be an appreciable fraction of the sample, up to 100%.

Figure 1:
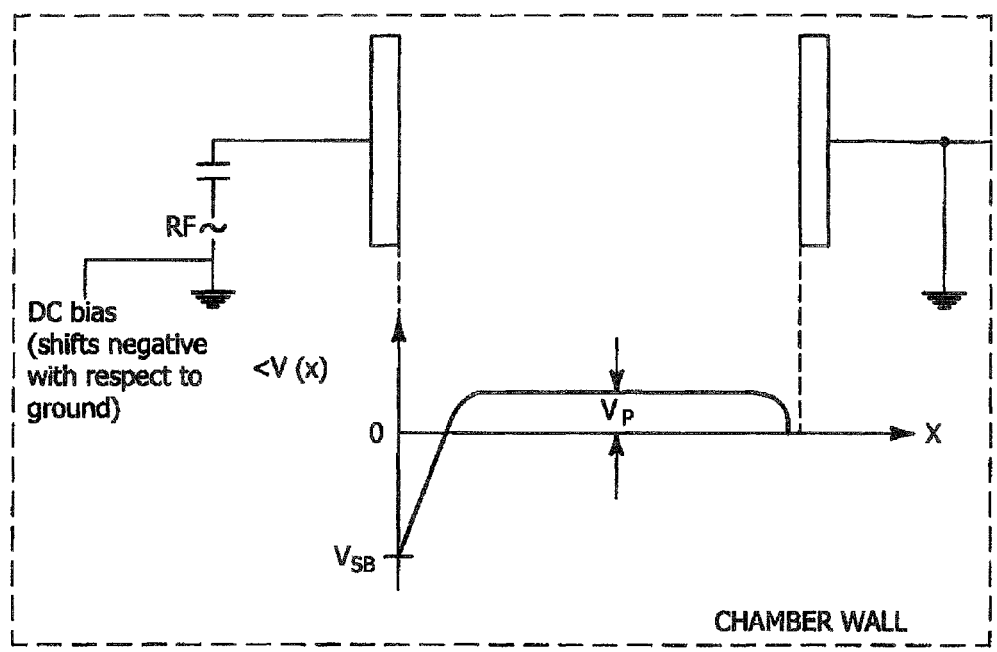
FIG. 1 is a graphical depiction of a time-averaged potential curve as a function of distance that develops in a capacitively coupled plasma system.

Now with reference to FIG. 1, there is shown a potential curve as a function of distance that develops in a capacitively coupled plasma system of the type addressed by the present invention. The antenna of the system becomes negatively biased at a value of $V_{SB}$. The plasma develops a positive potential, $V_P$, relative to the sample platform and chamber walls. There are potential drops that result in gradient potential fields or, more precisely, electric fields, between the plasma and the antenna and the plasma and ground. If no sample is present, the electric field is constant and perpendicular to the antenna. The values of $V_P$ and $V_{SB}$ depend on the plasma power, gas type, and gas pressure.

Figure 5:
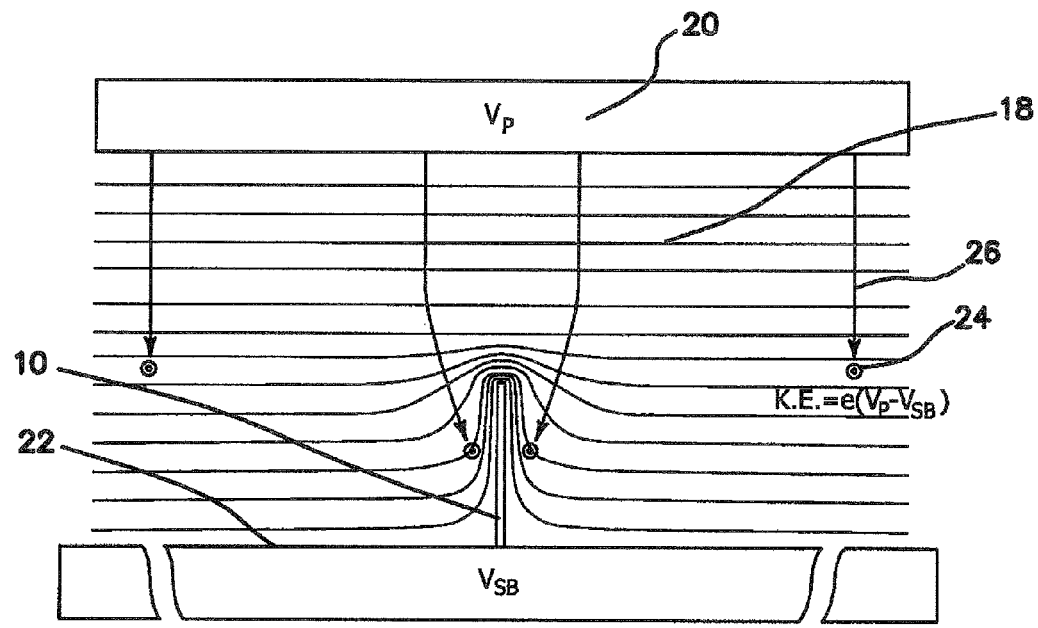
FIG. 5 is a schematic representation of the equipotential lines that develop between the plasma and the sample holder and a thin sample.

FIG. 5 is a schematic diagram illustrating the equipotential lines 18 that develop between the potential of plasma 20 that is RF generated by processing gas, and the potential of a sample holder 22 in a receptacle holder held at the self-bias potential of the capacitively coupled RF system's antenna. Far from the sample, the equipotential lines 18 are flat and equally spaced, which gives a uniform constant electric field. Closer to the sample, the equipotential lines 18 curve around the sharp corners of the sample 10. The smaller the radius of curvature, the higher the electric field and the closer the equipotential lines are to one another. The electric fields that develop around the sample 10 cause the gas ions 24, which are extracted from the plasma 20, to alter their trajectories 26 and bend towards the sample 10, since the bias voltage on the sample is negative. The energy of the ions from the plasma in units of eV is determined by the expression, $e(V_P-V_{SB})$.

Figure 6:
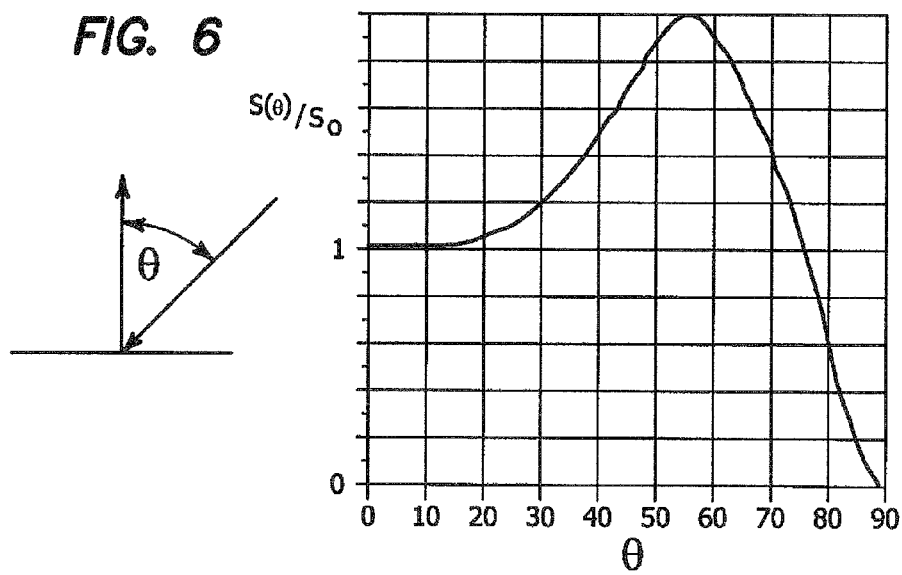
FIG. 6 is a graphical representation showing the relative sputter rate $S(\theta)/S_O$ as a function of incident angle for silicon by argon.

In FIG. 6, the relative sputter rate $S(\theta)/S_0$ is illustrated as a function of incident angle for silicon by argon, in one particular example. At non-normal and non-parallel incidence, the sputter removal rate is always higher.

Figure 7:
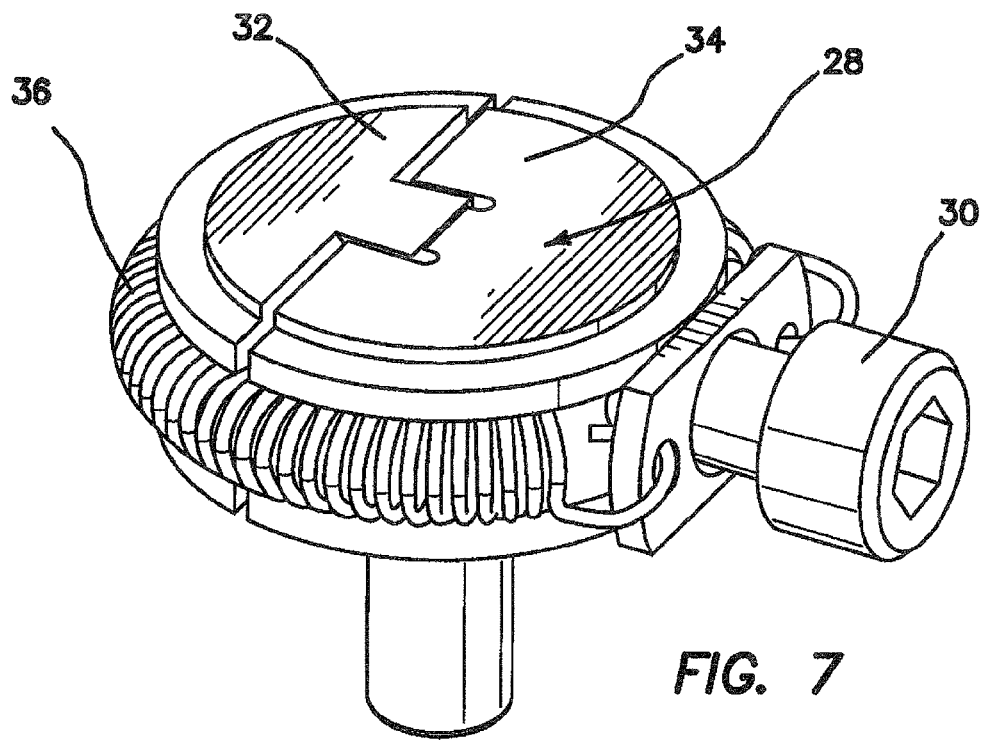
FIG. 7 is a perspective view of a sample holder which is used to clamp half grids or diced samples for TEM preparation by FIB.

In FIG. 7 there is shown a sample holder 28 constructed in accordance with the principles of the present invention. The inventive sample holder 28 is a modified version of an existing commercially available sample holder sold under the trademark FORTRESS by South Bay Technology, Inc. of San Clemente, Calif., the present assignee, although the inventive principles of the present invention are applicable to other sample holders as well. This type of sample holder 28 is used to clamp half grids or diced samples for TEM preparation by FIB in a vertical orientation relative to the plasma 20. A cap screw 30 is used to open jaws 32 and 34, and a spring 36 supplies the force necessary to close the jaws 32, 34 on the sample 10 when the cap screw 30 is loosened. A representative sample holder of this type is fully described in related U.S. application Ser. No. 11/712,830, already expressly incorporated herein in its entirety by reference.

Figure 8:
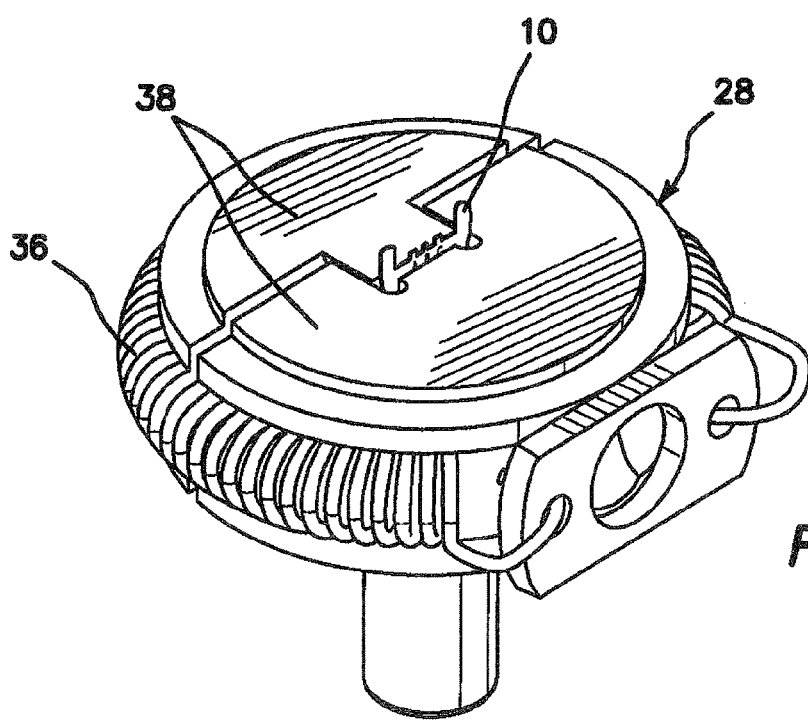
FIG. 8 is a perspective view of the sample holder illustrated in FIG. 7 with a commercially available grid in place in a vertical orientation.

FIG. 8 shows the sample holder 28 with a commercially available grid 10, available from Omniprobe, in place in a vertical orientation. In accordance with the principles of the present invention, a top surface of this holder 28 is coated with carbon paint 38, in order to minimize material from the holder 28 from sputter depositing onto the sample. The cap screw 30 is removed so that the assembly fits more easily into a receptacle holder and the sample is fully secured between the jaws 32, 34 by the clamping pressure provided by the spring 36.

Figure 9:
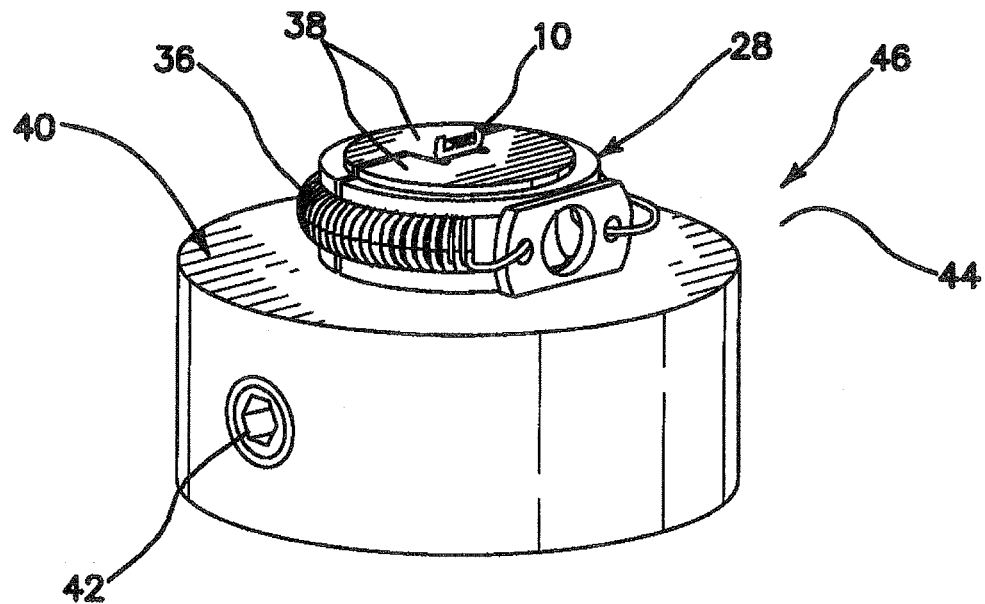
FIG. 9 is a perspective view of the sample holder illustrated in FIGS. 7 and 8, positioned in the simplest configuration of the present invention.

FIG. 9 illustrates the sample holder 28, positioned in the simplest plasma trimming configuration of the present invention. In this configuration, the sample holder 28 is inserted into a single elevated block or receptacle holder 40 and secured with a set screw 42. This assembly is then placed on the table 44 of a Reactive Ion Etching (RIE) system 46. In the RIE system 46, the table 44 is the RF antenna for a capacitively coupled plasma system. Alternatively, the RIE system 46 may comprise a plate that is isolated electrically from both ground and the antenna, and biased to a negative voltage.

Figure 10:
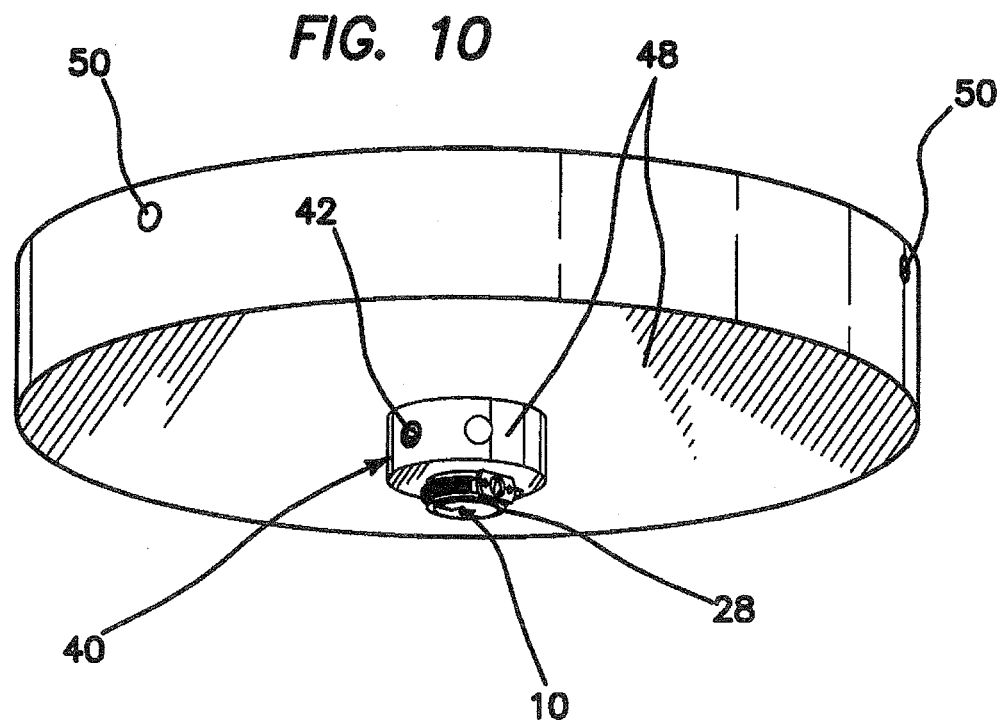
FIG. 10 is a perspective view of the sample holder of FIGS. 7-8, positioned in the simplest configuration of the present invention for a capacitively coupled RF plasma cleaner system.

In FIG. 10, there is illustrated the sample holder 28 positioned in the simplest configuration of the inventive plasma trimming system for use in a capacitively coupled RF plasma cleaner system. A coupling plate 48 is attached to the antenna at the top of a plasma chamber and it has an integrated receptacle holder in which the sample holder 28 is held in place with the set screw 42. The sample 10 is held in an inverted position perpendicular to the plasma. The integrated coupling plate and receptacle 48 is secured to the RF antenna for a capacitively coupled plasma system by three set screws 50. As shown in FIG. 10, the surface of the receptacle is at a different level relative to the level of the antenna adapter plate 48, so that there is no direct line-of-sight from anywhere on the adapter plate 48 to the sample 10. This feature of avoiding direct line-of-sight contact between the antenna and the sample assists in preventing, or at least minimizing, ion sputtering of system component material onto the specimen or sample 10 that is being trimmed.

Figure 11:
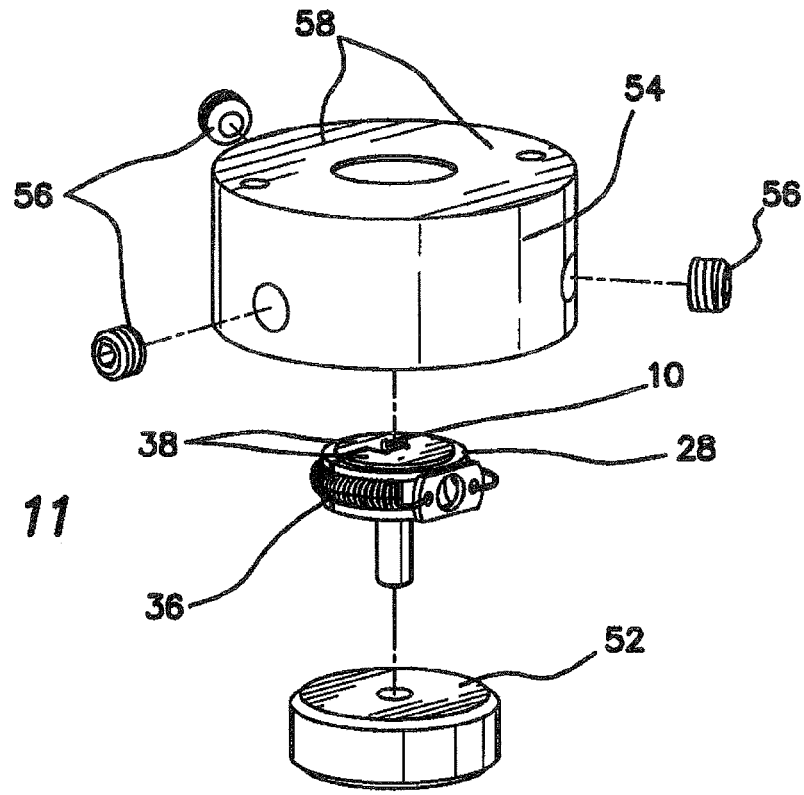
FIG. 11 is an exploded view of the sample holder of FIGS. 7-8, positioned in a preferred configuration of the invention for a capacitively coupled RF RIE system.

FIG. 11 illustrates an exploded view of the sample holder positioned in a preferred configuration of the inventive plasma trimming system for a capacitively coupled RF RIE system. The sample holder 28 is placed on a ring base platform 52, and a mating receptacle holder 54 is centered over the sample 10. Set screws 56 are used to center and secure the ring base platform 52 and sample holder 28 to the receptacle holder 54. The assembly is then set on the antenna platform of the RIE system. Again, in order to sharply reduce sputtering during the plasma trimming process, the top of the receptacle holder 54 is coated with carbon paint 58.

Figure 12:
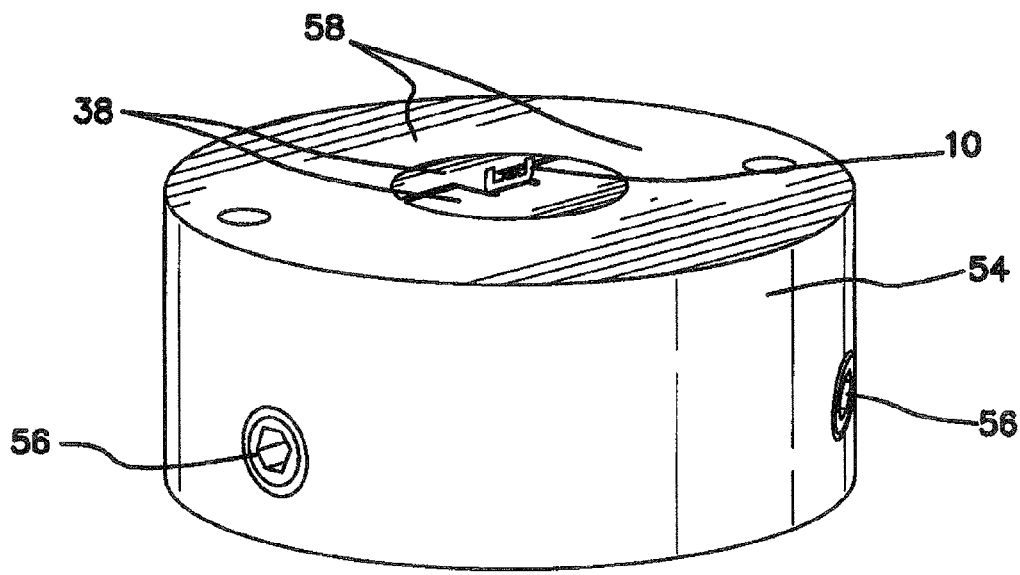
FIG. 12 is an assembled view of the embodiment shown in FIG. 11.

FIG. 12 shows the assembled view of the sample holder 28 and RIE receptacle holder 54, positioned in a preferred configuration of the invention for an RIE system.

Figure 13:
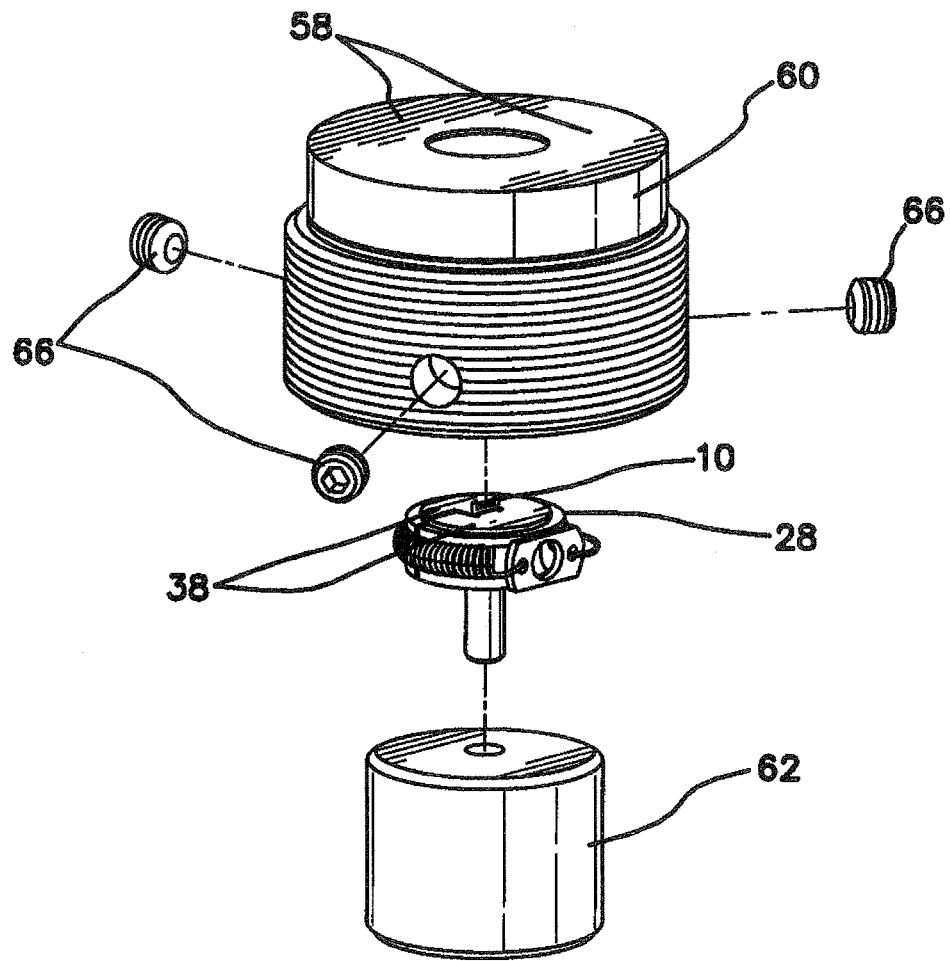
FIG. 13 is an exploded view of the sample holder of FIGS. 7-8 positioned in a preferred configuration of the invention for a capacitively coupled RF plasma cleaner system.

In FIG. 13, there is shown an exploded view of the sample holder 28 positioned in a preferred configuration for the sample holder and a plasma cleaner (PC) receptacle holder 60 of the invention for a capacitively coupled RF plasma cleaner system, adapted for plasma trimming. The sample holder 28 is placed on a ring base platform 62 and a mating receptacle holder 64 is centered over the sample 10. Set screws 66 are used to center and secure the ring base platform 62 and sample holder 28 to the receptacle holder 64. The assembly is then ready to screw into the antenna coupling plate.

Figure 14:
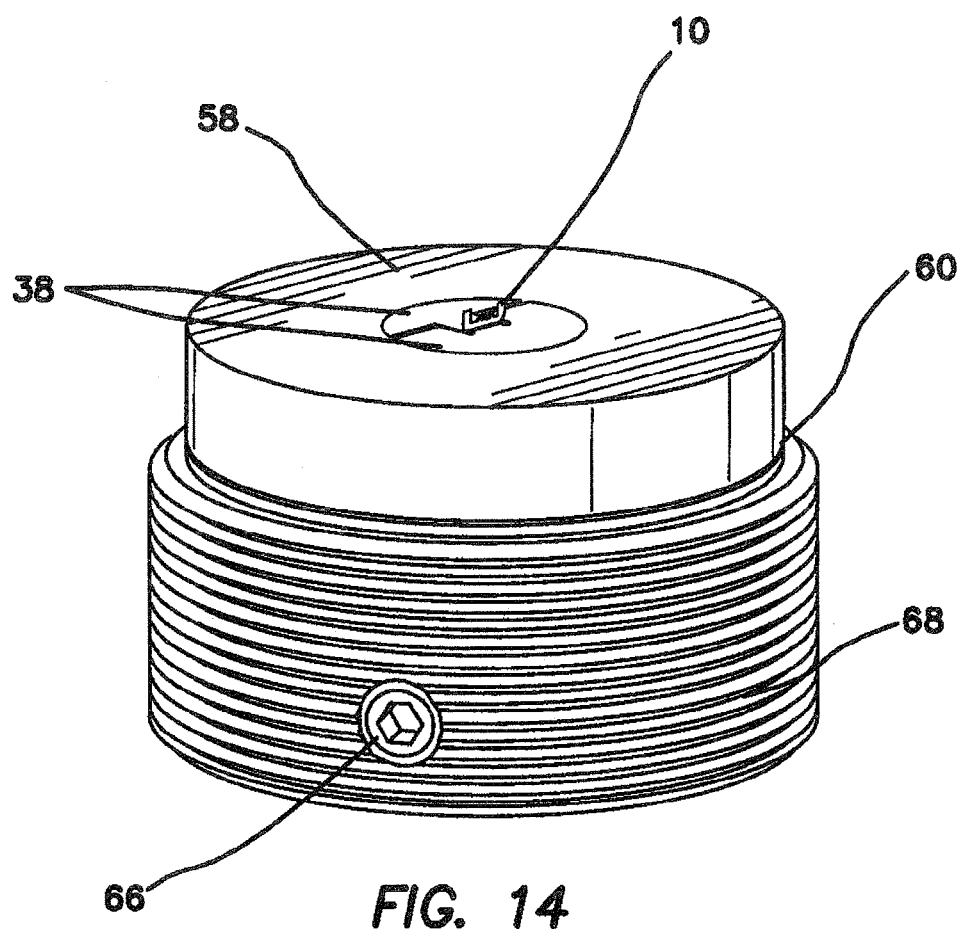
FIG. 14 is an assembled view of the embodiment shown in FIG. 13.

FIG. 14 shows the assembled view of the configuration shown in FIG. 13. Threads 68 on the receptacle holder 60 are provided for securing the receptacle holder 60 with the sample holder 28 to the antenna coupling plate on a capacitively coupled plasma cleaner system.

Figure 15:
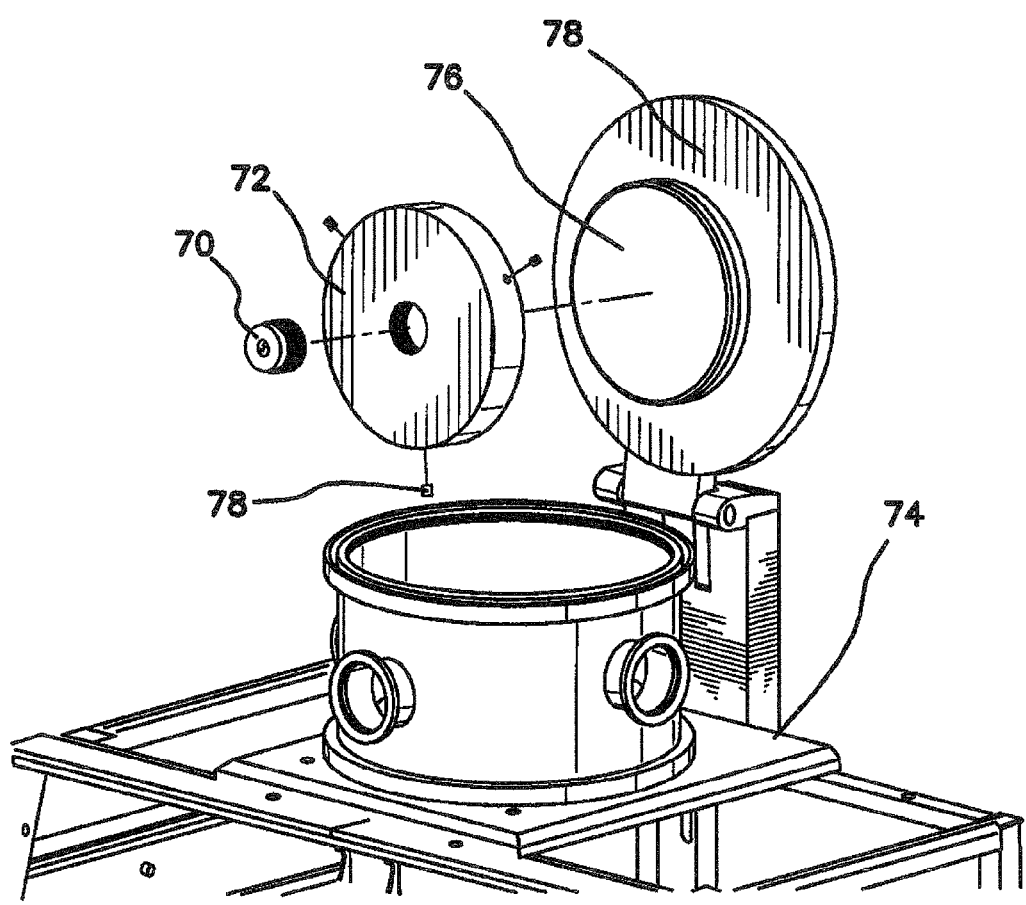
FIG. 15 is an exploded view of the sample holder and receptacle holder assembly of the present invention for a commercially available capacitively coupled RF plasma cleaner system.

FIG. 15 illustrates an exploded view of a sample holder and receptacle holder assembly 70 with an antenna coupling plate 72 for a commercially available capacitively coupled RF plasma cleaner system 74 in which an antenna 76 is integrated into a hinged vacuum sealing lid 78 for the vacuum chamber.

Figure 16:
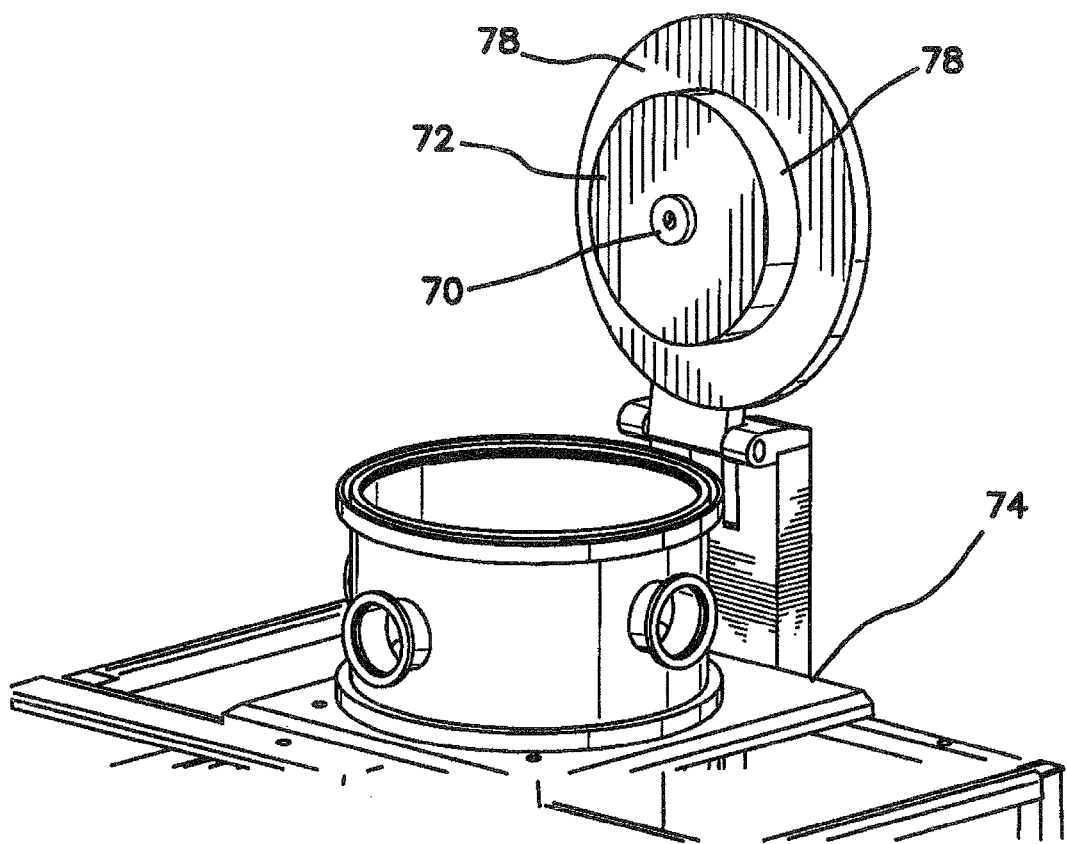
FIG. 16 is an assembled view of the embodiment shown in FIG. 15.

FIG. 16 shows an assembled view of the sample holder and receptacle holder assembly 70 with the antenna coupling plate 72 for a commercially available capacitively coupled RF plasma cleaner system 74 in which the antenna 76 is integrated into the hinged vacuum sealing lid 78 for the vacuum chamber.

Figure 17:
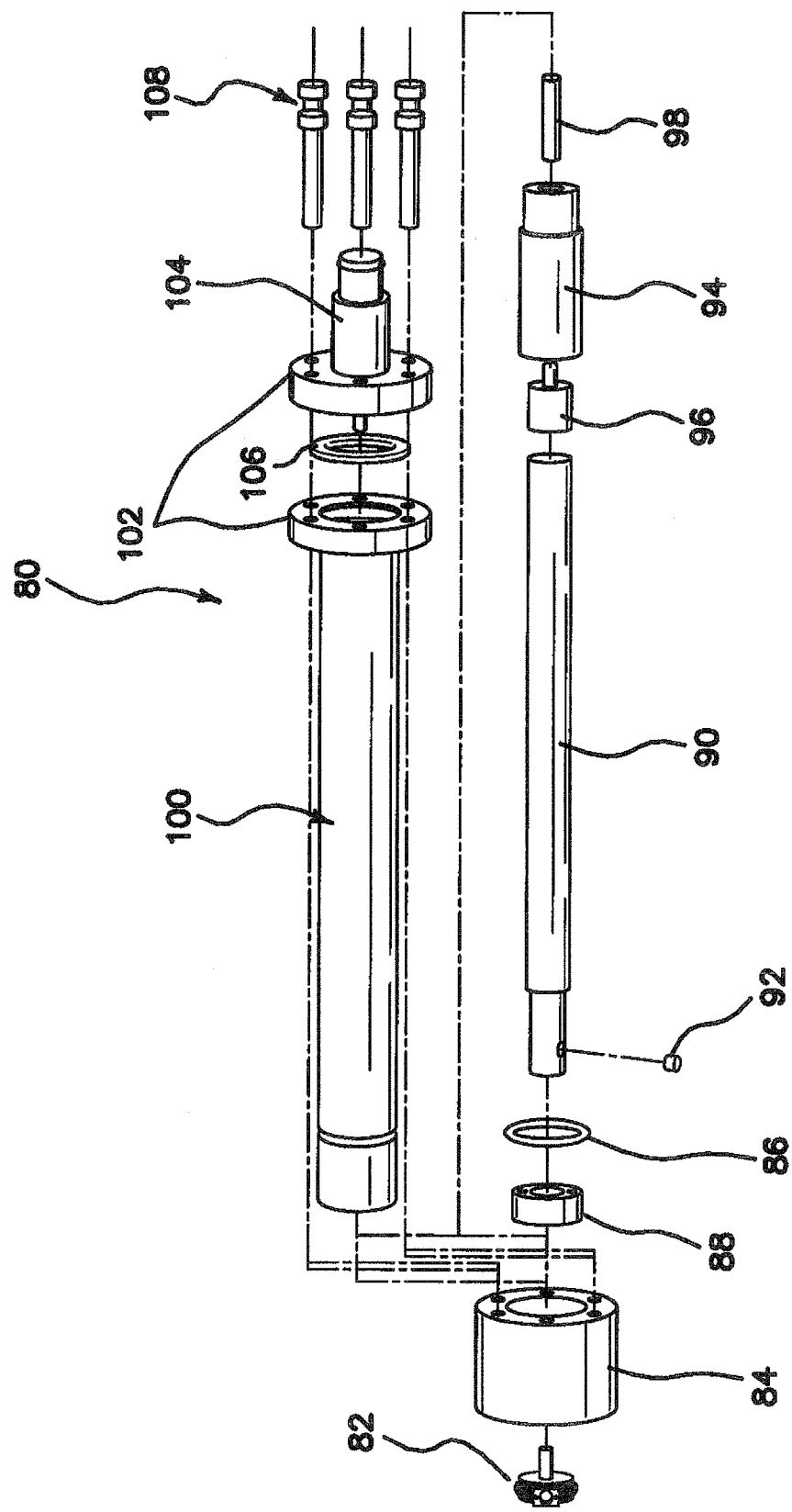
FIG. 17 is an exploded view of a plasma trimming rod constructed in accordance with the principles of the present invention, for adapting existing plasma cleaners for performing inventive plasma trimming procedures.

The foregoing description describes the plasma trimming systems and methods of the present invention using two primary arrangements. These arrangements include 1) a holder that sets on the antenna plate of a capacitatively coupled reactive ion etch system, and 2) a holder that is held onto the antenna of a capacitatively coupled plasma cleaner. Of course, these arrangements are intended to be exemplary rather than definitive, as the principles and concepts of the invention are potentially applicable to other suitable arrangements for holding and treating a microscopy sample using plasma ions. One such additional arrangement is illustrated in FIGS. 16 and 17. It employs a TEM rod-like geometry that can be used with the entry port to any plasma cleaner, including those in the prior art. In this arrangement, the sample is biased with an external power supply, rather than self-biasing with the antenna.

Now, with reference to FIG. 17, there is illustrated a plasma trimming rod 80 for adapting a plasma cleaner for plasma trimming purposes. The plasma trimming rod 80 comprises a specimen holder 82, a backing bolt plate and spacer 84, a vacuum O-ring 86, and a threaded insulator clamping screw 88. Other elements include a copper rod conductor and heat sink 90, on a distal end of which is disposed a specimen set screw 92. An insulator cup 94, conductor piston 96, and conductor spring 98 also form elements of the plasma trimming rod 80. Enclosing these elements is a vacuum grounded shroud 100 having a vacuum flange 102 and vacuum electrical feedthrough 104, for applying voltage from an external power supply (not shown) to a material sample disposed on the specimen holder 82, along the conductive center rod 90. A vacuum gasket seal 106 is provided for sealing the assembly, and vacuum flange bolts 108 secure the vacuum flange assembly together.

Figure 18:
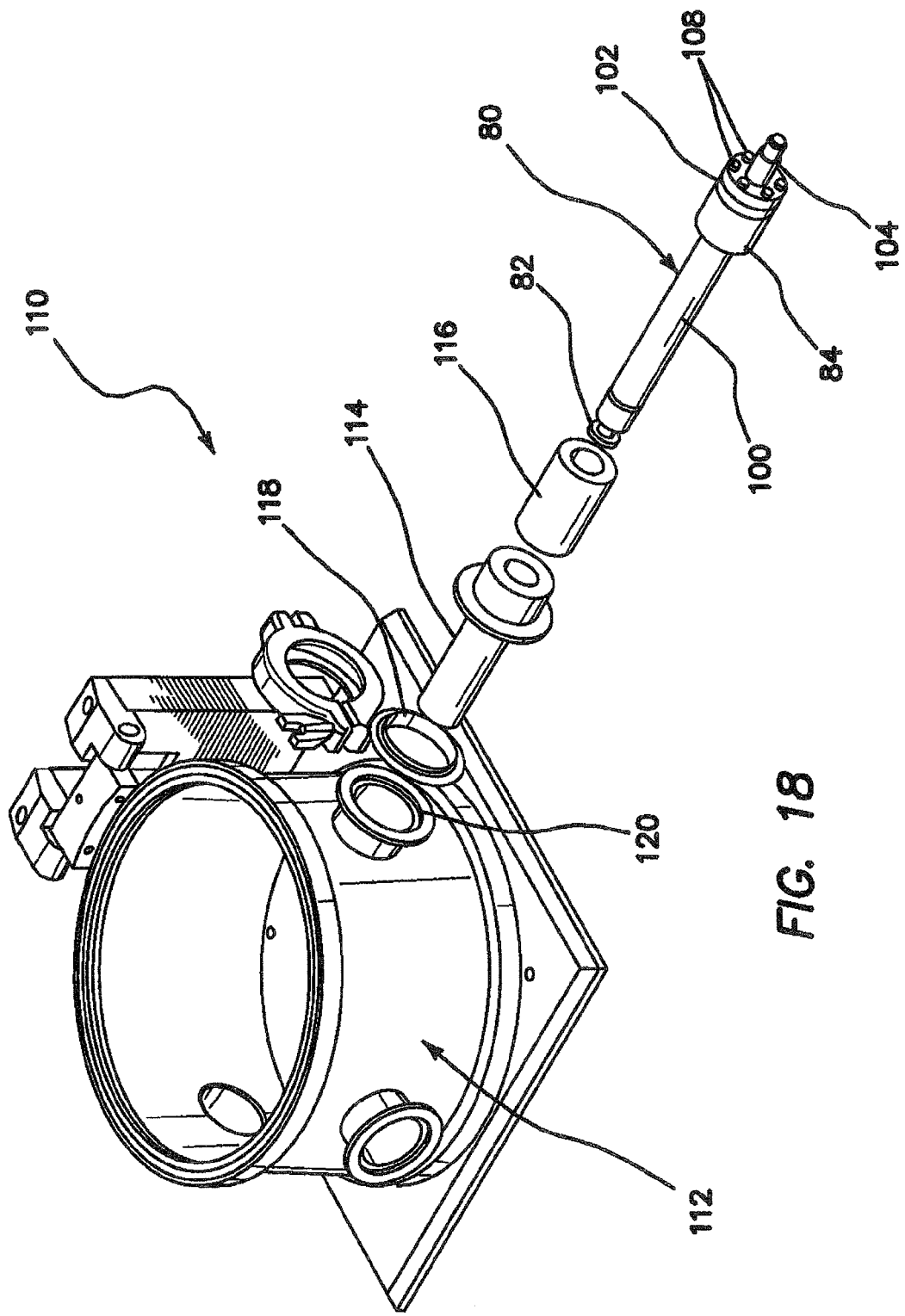
FIG. 18 is a perspective view showing the plasma trimming rod of FIG. 17 assembled to a plasma cleaning system.

Referring now to FIG. 18, a plasma trimming assembly 110 is illustrated, in which it can be seen how the plasma trimming rod 80 is assembled to a plasma cleaner vacuum chamber 112. The plasma trimming rod 80 is inserted into a plasma cleaner adapter 114 through a spacer 116. A vacuum O-ring 118 permits a sealed connection between the plasma trimming rod assembly 80 and the plasma cleaner vacuum chamber 112, through a vacuum chamber entry port 120. The adapter 114 acts as a grounded shroud for the exposed part of the center conducting rod 90 and sample holder 82.

Thus, in operation, to perform a plasma trimming operation, a suitable microscopy specimen to be processed is transferred to the specimen holder 82 of the plasma trimming rod 80. The plasma trimming rod 80 is then inserted into the plasma cleaner adapter so that the specimen is suitably mounted within the vacuum chamber 112 for plasma processing. The plasma is ignited, and the sample is negatively biased using an external power supply, which is preferably programmable. During processing, particularly for plasmas with high voltage potential, the sample may be shielded from sputtered material by withdrawing it into the adapter shroud. If a low power plasma is used, the sample can be exposed directly to the plasma without any problems. In this embodiment, as in previous ones, surfaces directly exposed to the plasma are coated or painted with graphite or other low sputter yield material in order to prevent material from being sputtered from those surfaces onto the sample. No cooling is required in this embodiment because of the low current draw.

As discussed above, the plasma trimming system of the present invention comprises several components that, when joined together, hold a TEM or emitter sample 10, hereinafter referred to as "the sample", in a position that is perpendicular to the main body of a plasma 20 and biases the sample 10 to a negative potential relative to the plasma 20 by either direct contact with the antenna in a capacitively coupled plasma system or by an external DC power supply. To avoid material from the system components from being sputtered onto the sample 10 and accumulating, even as prior sputtered material is being removed by the plasma trimming process, the inventor has found that the material of the system components that is in line of sight to the sample should be a material having a low sputtering yield. Preferably, this material is made from carbon, such as graphite, or coated with carbon or carbon paint. Carbon has a much lower sputtering yield compared to most materials. Because of this, the rate of removal of material from the sample, during the inventive plasma trimming process, significantly exceeds the rate of carbon sputtered onto the sample. As a result, the amount of carbon that remains on the sample after processing is minute. In the simplest form of the inventive plasma trimming system, as shown, for example, in FIGS. 9 and 10, an aluminum alloy holder 28 that uses a clamping mechanism 30, 32, 34 securely holds the sample 10 in an upright position. This holder is then placed in an aluminum alloy receptacle holder 40 that sits on the platform 44 of an RIE system 46 in which the platform 44 is the antenna of the capacitively coupled RF plasma system. The geometry of the receptacle table or plate with the antenna is such that any point on the antenna does not have a direct line-of-sight to the sample so that no sputtered antenna material can be deposited on the sample. The top of the receptacle plate and sample holder is either made from carbon or is carbon coated with a sufficiently thick layer that is not removed during the process. During operation that generates the RF plasma, the antenna develops a negative DC bias that gives the sample its bias. The thin edge of the sample creates high local electric fields that bend the positive gas ions extracted from the plasma towards the vertical surface of the sample and ion sputters the surface of the sample at a non-normal angle of incidence. This ion sputtering acts to remove damaged amorphous layers of the specimen. Corners of the sample with small radii of curvature have the highest field strengths. The gas used to generate the plasma is typically an inert gas such as Ar, but a mixture of gases can also be used. For example, reactive ion etching gas recipes can be used to improve the low energy removal of material. The energy of the ions striking the surface of the sample is determined by the difference between the plasma potential, V, and the self-bias on the antenna, $V_{SB}$. The same configuration can be used with an external biasing power supply. In this alternative configuration, the sample is held on a platform that is insulated from ground and the antenna is suspended within the plasma. Alternatively, the sample can be held in a grounded sheath to shield from sputtering, but with the sample close enough to the plasma to attract ions when the sample is biased from the external power supply. If the insulation also provides a vacuum seal, then the bias is delivered to the platform by electrical contact with a power supply external to the vacuum. The best application of this is where there is a grounded shield that prevents the whole platform and electrical conductor inside the vacuum system from being exposed to the plasma, and thus minimizes the current and power rating required for the external power supply. This external biasing configuration can be used with either a capacitively coupled or inductively coupled plasma system or a combination of the two.

The typical configuration of a capacitively coupled plasma cleaner is with the antenna above the platform where samples can be set. With this type of system, the invention uses a coupling plate to retain the receptacle holder with the sample held in an inverted position. Other than being in an inverted position, the process will be the same as in the RIE system. In one configuration, the receptacle plate is integral to the coupling plate and the sample holder is attached to it. In another configuration, the receptacle plate is separate from the coupling plate and is screwed into the coupling plate. The geometry of the receptacle plate with the antenna is such that any point on the antenna does not have a direct line-of-sight to the sample so that no sputtered antenna material can be deposited on the sample. The top of the receptacle plate and sample holder is either made from carbon or is carbon coated with a sufficiently thick layer that is not removed during the process.

The geometry of the sample is important to the successful implementation of the invention. The TEM sample or field emitter in the area of interest is, by the inherent requirement of the microscopy, thin relative to the rest of the sample, which basically acts as a support for the thin area. Because of this, the electric fields in the thinnest parts of the TEM sample or field emitter will be the highest and will cause the ions extracted from the plasma to bend from the straight trajectories and strike the sample at an angle that is neither normal nor parallel to the surface that has the amorphous damage from the prior FIB or ion beam processing. Since the energy can easily be controlled, low energy is used and the damage and amorphous region that remains on the sample after processing is minimized.

For the best implementation of the invention, the sample should be effectively cooled so that the ion current does not significantly heat the sample during the process. For a capacitively coupled system with the sample held on the antenna, this is achieved simply by water cooling the antenna. In this application, chilled water is preferred and a waiting period before processing insures that the sample temperature is equilibrated with the antenna.

In addition to removing amorphous and damaged regions from samples, the process can be used as a final thinning technique, bringing samples, such as tripod polished TEM samples or emitter samples, that are too thick for the appropriate microscopy technique to a suitable thickness.

FEATURES AND CONCEPTS OF THE INVENTION

1. The small radii of curvature on TEM, FIM, atom probe, and tripod polished samples provide relatively high electrical fields when a bias is applied to the sample.

2. A negative bias applied to the sample in an RF generated plasma functions to extract ions from the plasma, the trajectories of which are altered by the local electric fields at the biased sample.

3. The difference in the plasma potential and the bias voltage on the sample determines the energy of the ions.

4. The ions extracted from the plasma function to sputter remove material from the sample if their energies are above the threshold energy for sputtering.

5. By controlling the ion energy to low values, the amorphous region of FIB prepared TEM samples, FIB prepared field emitters, or TEM tomographic samples can be removed or significantly reduced.

6. By orienting the sample with the thin sections and the small radii of curvature towards the plasma, the deflected ions have a higher removal rate than ions arriving normal to the surface of the sample.

7. A sample holder and adapter holder in accordance with the invention is adapted to place the sample on the antenna of a capacitively coupled RF plasma system and to use the self-biasing of the antenna to bias the sample negatively.

8. The holder can be simply placed on the platform table of an RIE plasma system because the platform table is the antenna in an RIE system.

9. The holder can be placed on the antenna of a plasma cleaner system with the appropriate receptacle and adapter configuration.

10. The holder can be placed in an inductively or capacitively coupled RF plasma system and biased from an external power supply to the plasma system vacuum chamber by using a vacuum electrical feed through.

11. The geometry of the holder and adapters are designed to block material sputtered from the antenna and coupling system from depositing onto the system. In preferred embodiments, this is accomplished by ensuring that the surface of the receptacle is at a different level relative to the level of the antenna adapter plate, so that there is no direct line-of-sight from anywhere on the adapter plate to the sample.

12. Carbon materials, carbon coating, or carbon paint or other low sputter yield materials are used to eliminate the sputter deposition of holder and adapter materials that are in direct line-of-sight to the sample because the sputter rate of carbon with typical inert gas species used to sputter remove materials from sample is very low.

13. The sputter deposition rate onto the sample from the carbon materials is much lower than the removal rate of material from the sample so that no discernable or detectable accumulation of carbon on the sample occurs. The sputter removal of material from wedge shaped TEM samples produced by tripod polishing can be an alternative approach to the traditional method of using a focused ion beam for removal of the polishing damage and further thinning of the sample.

14. The invention can be employed to adapt commercially available plasma cleaners that are commonly used in TEM laboratories to perform the inventive plasma trimming function.

15. By using the self-biasing approach with a water-cooled antenna on a capacitively coupled RF plasma cleaner or capacitively coupled RF reactive ion etch system, the sample holder is also cooled and prevents appreciable heating of the sample.

Accordingly, although an exemplary embodiment of the invention has been shown and described, it is to be understood that all the terms used herein are descriptive rather than limiting, and that many changes, modifications, and substitutions may be made by one having ordinary skill in the art without departing from the spirit and scope of the invention.

What is claimed is:

1. A plasma system for removing material from a surface of a microscopy sample to remove surface damage and for further controlled thinning of the microscopy sample, comprising:
   a microscopy sample holder for retaining a microscopy sample in place in a desired orientation;
   a plasma cleaning apparatus comprising a vacuum chamber and an entry port for entry thereinto, the vacuum chamber comprising a hinged vacuum sealing lid;
   an antenna integrated into the vacuum sealing lid;
   a plasma trimming rod assembly comprising a conductor piston and a conductor spring for supporting said sample holder;
   a plasma cleaner adapter for facilitating entry of the plasma trimming rod assembly into said plasma cleaner vacuum chamber through said entry port;
   a vacuum o-ring for sealingly connecting the plasma cleaner vacuum chamber to the plasma trimming rod assembly;
   an adapter disposed about the plasma trimming rod as a grounded shroud; and
   an external power supply for biasing said sample;
   wherein the rod may be withdrawn proximally so that the specimen is surrounded by the grounded shroud during plasma processing.

2. The system as recited in claim 1, wherein the plasma trimming rod assembly is inserted into the plasma cleaner adapter.

3. The system as recited in claim 1, wherein the antenna is an RF antenna.

4. The system as recited in claim 1, and further comprising an antenna coupling plate.

\* \* \* \* \*